(12) United States Patent
Pruefer

(10) Patent No.: US 10,299,386 B2
(45) Date of Patent: May 21, 2019

(54) PLACEMENT MACHINE AND METHOD FOR EQUIPPING A SUBSTRATE WITH UNHOUSED CHIPS

(71) Applicant: ASM Assembly Systems GmbH & Co. KG, Munich (DE)

(72) Inventor: Martin Pruefer, Munich (DE)

(73) Assignee: ASM ASSEMBLY SYSTEMS GMBH & CO. KG (DE)

( * ) Notice: Subject to any disclaimer, the term of this patent is extended or adjusted under 35 U.S.C. 154(b) by 284 days.

(21) Appl. No.: 15/222,034

(22) Filed: Jul. 28, 2016

(65) Prior Publication Data
US 2017/0034921 A1 Feb. 2, 2017

(30) Foreign Application Priority Data
Jul. 30, 2015 (DE) .......................... 10 2015 112 518

(51) Int. Cl.
*H05K 3/30* (2006.01)
*H01L 21/67* (2006.01)

(52) U.S. Cl.
CPC ......... *H05K 3/30* (2013.01); *H01L 21/67144* (2013.01); *Y10T 29/4913* (2015.01)

(58) Field of Classification Search
CPC .... H05K 13/04; H05K 3/202; H05K 13/0053; H05K 13/0413; H05K 13/408; H05K 3/30; H05K 13/02; B25B 11/005; Y10T 29/53178; Y10T 29/5313; Y10T 29/4913; Y10T 29/49131; Y10T 29/49133
USPC ......................................................... 29/832
See application file for complete search history.

(56) References Cited

U.S. PATENT DOCUMENTS

| 6,792,676 B2* | 9/2004 | Haji ................. H01L 21/67144 29/739 |
| 9,704,732 B2* | 7/2017 | Hwang ............. H01L 21/67144 |
| 10,103,041 B2* | 10/2018 | Suzuki ............. H01L 21/67132 |
| 2003/0057381 A1* | 3/2003 | Hirayanagi ........... B82Y 10/00 250/491.1 |
| 2004/0036041 A1* | 2/2004 | Hoehn ............... H05K 13/0413 250/559.3 |
| 2012/0015458 A1* | 1/2012 | Akamatsu ........... H05K 13/021 438/15 |

FOREIGN PATENT DOCUMENTS

| JP | 2005317806 A | * | 11/2005 | ............ H02K 13/04 |
| JP | 2012069730 A | * | 4/2012 | ............ H01L 21/52 |

* cited by examiner

*Primary Examiner* — Thiem D Phan
(74) *Attorney, Agent, or Firm* — Ostrolenk Faber LLP

(57) ABSTRACT

A placement machine for equipping a substrate with unhoused chips is described. The placement machine has a chassis on which is mounted a feed device, providing a wafer which has a multiplicity of chips. A lifting device is mounted on the chassis, and a substrate-receiving device for receiving the substrate is mounted on the lifting device is movable relative to the chassis by the lifting device. The substrate-receiving device has a one-piece support element, which constitutes at least an upper part of the substrate-receiving device, wherein the substrate to be equipped can be laid on the one-piece support element; and a transport device for transporting the substrate on an upper side of the one-piece support element along a transport direction. The transport device is spatially integrated in the one-piece support element on the upper side of the one-piece support element.

20 Claims, 5 Drawing Sheets

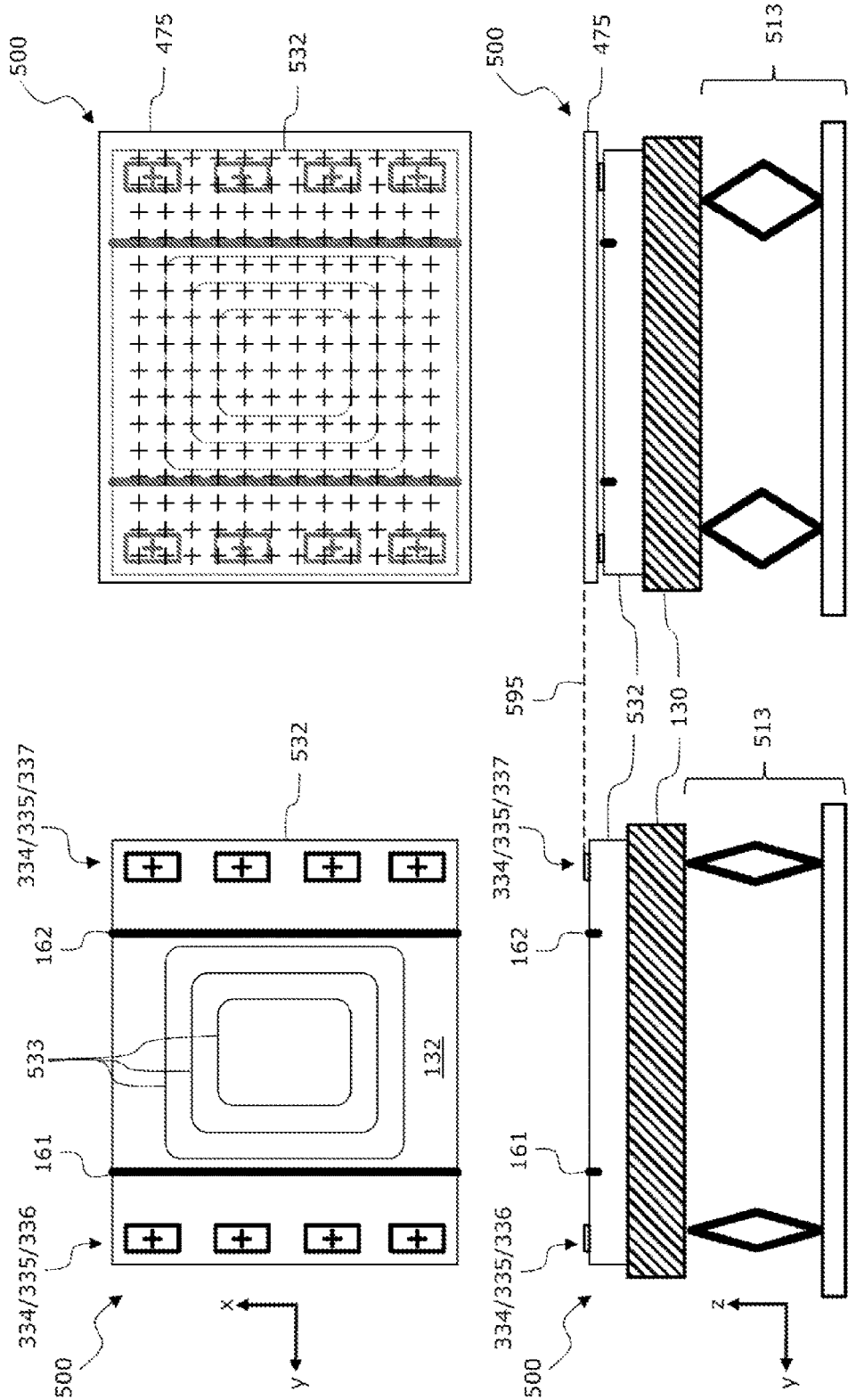

PLACEMENT MACHINE AND METHOD FOR EQUIPPING A SUBSTRATE WITH UNHOUSED CHIPS

TECHNICAL FIELD

The present invention relates in general to the technical field of production of electronic components. The present invention in particular relates to a placement machine and to a method for handling unhoused chips within the scope of manufacture of electronic components which each have at least one chip packaged in a housing and suitable electrical connection contacts by means of which the packaged chip can be electrically contacted.

BACKGROUND OF THE INVENTION

When manufacturing housed electronic components, unhoused (semiconductor) chips, or what are known as "bare dies", are placed on a substrate. Within the scope of what is known as the "embedded Wafer Level Package" (eWLP) process, one or more chips per package are for this purpose placed with the active side down onto an adhesive film disposed on the substrate. A multiplicity of set-down chips are then potted using a compound made of plastic, which later constitutes the housing. The entire potted product is then fired at high pressure and then released from the substrate or the adhesive film. In the following process steps, the chips are then contacted, possibly electrically connected, and solder balls serving as electrical connection contacts are applied. At the end, the entire processed potted product is sawn into individual components or otherwise separated.

More specifically, an eWLP is a housing model for integrated circuits in which the electrical connection contacts are produced on a wafer artificially manufactured from chips and potting compound. All necessary processing steps for forming a housing are thus carried out on the artificial wafer. Compared with conventional housing technologies, in which what is known as "wire bonding" is used, this allows the production of an extremely small and flat housing having excellent electrical and thermal properties with particularly low production costs. With this technology, components can be produced for example as a ball grid array (BGA).

A further integration approach known in microelectronics is the production of what are known as system-in-package (SiP) modules. In the case of an SIP process, passive and active components and also further components are produced from a plurality of (semiconductor) chips, and these chips are then set down by means of a placement process on a substrate, wherein the substrate can be an epoxy printed circuit board material, an adhesive film or a metal foil, for example. The set-down chips are then combined by means of known construction and connection techniques in a housing, often referred to as an IC package. Necessary electrical connections between the individual chips can be provided for example by means of bond wires, wherein other connection principles such as conductive thin films on side edges of the chips or feedthroughs are also possible.

Chips that are still unhoused are handled within the scope of an eWLP process or when manufacturing SIP modules typically by means of a (modified) placement machine compared with the known Surface Mount Technology. A placement machine of this type has a placement head, by means of which the chips are placed on the substrate in question at predefined placement positions. Here, the requirements on the positional accuracy of the placement are particularly high. A positional accuracy or placement accuracy of 15 μm/3σ or more accurate is currently required both for an eWLP process and for the production of SIP modules, wherein σ (sigma) is the standard deviation for the placement position. Due to the increasing miniaturization of electronic components, it is anticipated that even greater requirements will be placed on the placement accuracy in the future.

When manufacturing both eWLP and SIP modules, an extremely large number of chips are placed on a relatively large-area substrate for efficiency reasons. Here, substrates can also be so large or long that they must be moved along a transport direction during the course of a placement process taking a very long time. Where appropriate, a clocked placement in a placement region of the placement machine in question might also be necessary in the case of a particularly long substrate. Here, different parts of the substrate to be equipped are introduced into the placement region in succession (possibly with a certain spatial overlap), and are equipped there with chips. In this regard, it is clear that large or long substrates make it additionally difficult to observe a high placement accuracy.

The object of the present invention is to specify a placement machine and a method for equipping a substrate with unhoused semiconductor chips which enables a particularly high placement accuracy, even with the use of large substrates.

SUMMARY OF THE INVENTION

This object is achieved by the subjects of the independent claims. Advantageous embodiments of the present invention are described in the dependent claims.

In accordance with a first aspect of the invention, a placement machine for equipping a substrate with unhoused chips is described, which machine can be used in particular for the purpose of producing electronic components which each have at least one chip disposed in a housing which in particular comprises a cured potting compound. The described placement machine has (a) a chassis; (b) a feed device for providing a wafer which has a multiplicity of chips, wherein the feed device is mounted on the chassis; (c) a lifting device, which is mounted on the chassis; (d) a substrate-receiving device for receiving the substrate to be equipped, wherein the substrate-receiving device is mounted on the lifting device and can be moved relative to the chassis along a z-direction by means of the lifting device; and (e) a placement head for picking up chips from the provided wafer and for placing the picked-up chips at predefined placement positions on the received substrate. In accordance with the invention, the substrate-receiving device has (d1) a one-piece support element, which constitutes at least an upper part of the substrate-receiving device, wherein the substrate to be equipped can be laid on the one-piece support element; and (d2) a transport device for transporting the substrate on an upper side of the one-piece support element along a transport direction. The transport device is spatially integrated in the one-piece support element on the upper side of the one-piece support element.

The described placement machine is based on the finding that, by means of an integration of a transport function (provided by the described transport device) in the one-piece support element of the substrate-receiving device, the substrate-receiving device and in particular one-piece support element thereof can have, perpendicularly to the transport direction, a spatial dimension, referred to hereinafter as width, which is greater than the width of the transport device. Should the substrate to be equipped have a width which is smaller than the width of the one-piece support element, there is still space or room available at least at an edge region of the one-piece support element, in which place or space markings can be applied to the surface of the one-piece support element. With a preferably symmetrical arrangement, there are still possibilities, for the specified case (the substrate to be equipped is narrower than the one-piece support element), for applying clearly visible markings to the support element to the left and right of the transport device at two edge regions of the one-piece support element distanced from one another perpendicularly to the transport direction. Such markings, preferably manufactured from glass, can be used, as is known, as reference markers for an accurate visual position determination of placed chips or, in the event of a calibration of the placement machine, of special calibration modules likewise placed. Such calibration modules can be, for example, ceramic or glass modules, which assimilate the chips to be placed in terms of shape and/or size.

More specifically, due to the described integration of the transport device, it is no longer necessary to provide a transport device having two transport rails which are arranged, with respect to the transport direction, to the left and right of the substrate-receiving device and in particular of the one-piece support element. If, in order to ensure a high placement accuracy, an optical measurement of markings is necessary, these markings can now be applied to the one-piece support element to the left and/or right of the substrate to be equipped. With respect to the transport direction, it is therefore not necessary to use markings before and/or after the substrate to be equipped. With the described placement machine, components advantageously can be placed in principle in substrates of infinite length without having to dispense with an accurate visual check of the position of inserted chips with regard to markings applied to the one-piece support element.

The one-piece support element is preferably formed in such a way that the substrate to be equipped can be placed flat. This does not mean that the entire underside of the substrate must rest flat. Rather, in particular for the integrated transport device, preferably small regions of the upper side of the one-piece support element cannot bear against the underside of the substrate to be equipped. Nevertheless, due to an accordingly large-area resting of a substrate to be equipped on a one-piece support element, it is possible to prevent the substrate to be equipped from warping relative to the one-piece support element during a placement operation in which a multiplicity of chips are placed. This is true in any case, provided a sufficient flat fixing of the substrate to be equipped on the one-piece support element is ensured. Due to an elimination or due to at least a large reduction of spatial warping of the substrate to be equipped, a particularly high placement accuracy can be ensured.

By means of the described lifting device, a uniform vertical position of the placement plane in question can be ensured even for substrates to be equipped of varying thickness, which likewise leads to a high placement accuracy. This is also true in the event of a calibration, which is necessary from time to time, of the placement machine with respect to the surface of a special calibration plate which on its upper side has a multiplicity of highly-accurately applied markings and on which special calibration modules are placed or set down in the known manner. More specifically, a calibration plate of this type, often also referred to as a "mapping plate", can be raised or lowered accurately to the intended populated plane via its surface. A calibration of the placement machine can thus be carried out with a particularly high accuracy, which in turn leads to a particularly high placement accuracy when a substrate is subsequently equipped with chips.

The placement head can, in accordance with an exemplary embodiment, have a plurality of holding devices each for temporarily receiving a chip. The use of what is known as a multiple placement head has the advantage that, within a very short time, a plurality of chips can be received by the placement head from the feed device, and this plurality of chips can then be transported jointly to the placement region, and can be placed there on the substrate at predefined placement positions. In this way, the placement efficiency of the described placement machine is significantly increased compared with a placement machine having just a basic placement head.

It should be noted that in this document the term "mounted" is to be understood to mean that a first component of the placement machine can be mounted directly or indirectly on a second component of the placement machine. A direct "mounting" can include a detachable fastening or a non-detachable fastening, wherein a non-detachable fastening can also mean that the two components in question can be separated from one another only following a detachment of typically at least one permanent fastening means, such as a screw or rivet. "Mounted" can also mean that the components in question are arranged in a stationary manner or alternatively also displaceably relative to one another.

It should also be noted that in this document the term "electronic component" is to be understood in particular to mean a housed electronic component which has (a) a chip, (b) a housing surrounding the chip and (c) suitable electrical connection contacts for the chip. An "electronic component" can be, for example, a component intended for surface mounting which typically is referred to as a surface mount device (SMD) component. By contrast, in this document, the term "chips" is understood in particular to mean unhoused semiconductor plates (bare dies) which, as is known, are produced by separation from a processed semiconductor wafer.

The placement machine, in accordance with an exemplary embodiment, can also have a "surface" positioning system likewise mounted on the chassis. The positioning system in turn has (a) a first component, which is arranged in a stationary manner with respect to the chassis, (b) a second component, which is movable along a predefined first direction with respect to the first component, and (c) a third component, which is movable along a predefined second direction with respect to the second component. The placement head is fastened to the third component. The first direction is at an angle to the second direction. Here, the term "at an angle" is understood to mean any non-parallel orientation of the two directions.

By means of a suitable control by a first linear drive assigned to the first component and the second component, and by a second linear drive assigned to the second component and the third component, the third component and therefore the placement head fastened thereto can be freely moved within a specific two-dimensional movement range. In the case of the described placement machine, this movement range extends from a spatial region of the feed device, in which the chips to be placed are received, to a placement region in which the substrate to be equipped is disposed and in which the chips are set down.

The two specified directions, which are preferably oriented perpendicularly to one another, can be defined by two axes, for example an x-axis (parallel to the transport direction) and a y-axis (perpendicular to the transport direction). These two axes can span a coordinate system of the described placement machine.

The first component of the positioning system can have a stationary guide rail, which extends along the x-axis. The movable second component can be a transversely extending support arm, which is arranged on the first component displaceably along the x-axis and extends along the y-axis. The third component of the positioning system can be arranged on the transversely extending support arm and can be movable along a rail extending along the longitudinal direction of the transversely extending support or along the y-axis.

In accordance with an exemplary embodiment of the invention the transport device has two transport elements, which extend along the transport direction and are distanced from one another perpendicularly to the transport direction and are formed in such a way that the substrate to be equipped can be laid via its underside on the two transport elements.

The distance between the two transport elements can be fixed or variable. By way of example, at least one of the two transport elements can be integrated in various elongate recesses in the one-piece support element. This means that different recesses can be provided for at least one transport element, wherein a certain one of the various recesses can be selected for example depending on the width of the substrate to be equipped.

The two transport elements are preferably arranged symmetrically with respect to a centerline of the substrate on which the chips are to be placed. In this case, the distance between the two transport elements by way of example can be greater than approximately $6/10$, preferably greater than approximately $8/10$ and more preferably greater than approximately $9/10$ of the width of the substrate to be equipped. Of course, the distance between the two transport elements must be smaller than the width of the substrate to be equipped, because otherwise this substrate cannot rest on the two transport elements.

The transport elements can, as is known, each have a transport belt, which is tensioned between at least two rolls and is driven by at least one of the two rolls. The material of the two transport belts should be adapted to the material and/or to the surface nature of the underside of the substrate to be equipped, such that a sufficiently high coefficient of friction exists between the transport belt and substrate and therefore a reliable transport of the substrate to be equipped is ensured.

Of course, instead of a transport device having two transport belts, other transport devices can also be used. Depending on the specific application, transport devices which are based on the principle of conveyance by vibration which have what are known as index pins and/or which transport the material to be transported, here the substrate, on an air cushion can be used, for example.

In accordance with a further exemplary embodiment of the invention the two transport elements each have a transport belt. Furthermore, two transport grooves are formed in the one-piece support element, which extend along the transport direction and are formed in such a way that a transport belt extends in each transport groove. This has the advantage that the structural features of the substrate-receiving device and in particular of the one-piece support element necessary for an integration of the transport device can be implemented in a particularly simple manner.

In accordance with a further exemplary embodiment of the invention the transport device has two operating states, wherein (i) in a first operating state the transport device is fully integrated in the one-piece support element, such that the entire transport device is disposed below a support plane determined by the upper side of the one-piece support element, and wherein (ii) in a second operating state at least part of the transport device is disposed above the support plane.

More specifically, the second operating state can be referred to as an activated operating state, because only in this operating state does the substrate to be equipped also actually rest on the transport device and only then is transport possible along the transport direction. Accordingly, the first operating state can be referred to as a deactivated operating state of the transport device, because in this case there is no interaction between the transport device and the substrate to be equipped. In the first operating state, chips are placed on the substrate to be equipped. In the second operating state, the substrate to be equipped is transported along the transport direction to its processing position, which is preferably disposed at least approximately in the geometric center of the support element, not only with respect to the width of the one-piece support element, but also with respect to the length (in the transport direction) of the one-piece support element.

The support plane can coincide with the upper side of the one-piece support element. In the first operating state a particularly good mechanical coupling or flat and detachable connection between the one-piece support element and the substrate to be equipped can thus be achieved. As already explained above, mechanical warping of the substrate to be equipped can thus be prevented or at least reduced, and therefore the placement accuracy of the placement machine can be increased.

It should be noted that, in some circumstances, a plurality of spacer elements can also be provided on the upper side of the one-piece support element, which spacer elements preferably all have the same height. The substrate to be equipped thus then lies not directly on the surface of the one-piece support element, but merely indirectly (via or by way of the spacer elements) on the one-piece support element. Although the spatial position of the substrate to be equipped with respect to the one-piece support element is thus no longer defined as accurately and this has certain disadvantages with respect to the achievable placement accuracy, an embodiment of this type can be advantageous in particular when the underside of the substrate to be equipped is mechanically sensitive. In this case, damage to the underside of the substrate to be equipped can be reliably prevented by a suitable selection of the material at least of the upper sides of the aforementioned spacer elements.

A first transition from the first operating state into the second operating state (lifting of the transport element in question) and/or a second transition from the second operating state into the first operating state (lowering of the transport element in question) can be implemented in different ways. Thus, (the axes of rotation of) at least some rolls for transport belts can be vertically displaceable and for example can rest on an adjustment element having a sawtooth-shaped upper edge. In this case the vertical position of the rolls in question can be changed by a displacement of an adjustment element of this type. The rolls in question or the axes of rotation of the rolls in question can be spring-mounted, for example, in order to automatically return in particular upwardly into their lower starting state following a deflection. However, it should be noted that the height of the transport belts or of the transport device can be adjusted in a very wide range of ways, which are known to a person skilled in the art, that is to say a designer in the field of mechanical engineering, and therefore will not be explained in greater detail at this juncture.

In accordance with a further exemplary embodiment of the invention the one-piece support element has a pneumatic interface, by means of which a negative pressure can be applied to a lower surface of the substrate. Due to a fixing by means of negative pressure, the substrate can be held with extremely high accuracy and without inner warping in a predefined position on the one-piece support element and therefore can also be held in a predefined position within the placement machine.

More specifically, the substrate to be equipped is suctioned via the pneumatic interface at the substrate-receiving device or at the one-piece support element. Provided the surface of the substrate which bears against the pneumatic interface is acted on with a sufficient negative pressure, an accidental shifting of the substrate is reliably prevented. Compared to a detachable fixing of the substrate by means of known clamping mechanisms for printed circuit boards to be equipped with housed electronic components, the described pneumatic fixing of the substrate to be equipped with unhoused chips has the great advantage that it is much more temperature-stable. This is due to the fact that the various components of known clamping mechanisms have different geometries and therefore are subjected to different thermal expansions, and therefore the type of clamping also changes simultaneously in the event of a change in temperature. In the case of known clamps, the position of at least part of the substrate to be equipped with chips within a placement machine typically moves.

Apart from the temperature stability already mentioned, the described pneumatic fixing, compared with a conventional clamp, has the advantage that, with a suitable embodiment of the substrate-receiving device, the substrate can be fixed flat in a simple manner on an upper side of the substrate-receiving device or on the one-piece support element. Even undesirable curvatures of regions of the substrate upwardly or away from the one-piece support element thus can be prevented. In this context, it should be noted that there may be a deflection of the printed circuit board in question in the case of a side clamp used typically for the printed circuit boards to be equipped. A deflection of the substrate downwardly could thus indeed be prevented, as is known, by suitable support pins, however an undesirable deflection upwardly can only be prevented in a simple manner by the pneumatic fixing, described here, of the substrate to be equipped with unhoused chips, because the upper side of the substrate must be freely accessible for the placement.

More precisely, the described substrate-receiving device with its pneumatic interface constitutes a vacuum-fixing tool, with which the substrate to be equipped can be fixed within the placement machine such that the surface of the substrate lies exactly at the height of a plane of the placement machine, in which plane the chips can be placed best and in particular with the greatest placement accuracy.

In order to ensure a positionally accurate fixing of the substrate within the described placement machine, even with fluctuating ambient temperatures, it is merely necessary for the one-piece support element to be embodied in such a way that the geometry thereof has only a very low temperature dependency. This can be implemented for example by the use of suitable materials, such as an Invar alloy, which consists of approximately 64% iron and 36% nickel and which, as is known, has a very low coefficient of thermal expansion.

The pneumatic interface, in accordance with one exemplary embodiment, can have a groove which can be acted on by the negative pressure generated by a negative pressure generation unit. Here, the negative pressure generation unit can be a unit which is an external unit with respect to the described placement machine and can be coupled merely pneumatically to the substrate-receiving device. However, the negative pressure generation unit can also be assigned to the described placement machine. In particular in the latter case, the described negative pressure generation unit can also be used, for example for synergy reasons, for the generation of a negative pressure which, as is known, is used in order to temporarily receive chips at what are known as suction pipettes of the placement head.

The use of a groove to transfer the negative pressure to the surface of the substrate has the advantage that this negative pressure can be applied not just at individual points, but along a line. Here, the shape and/or the length of the groove can be adapted to the size and/or to the mechanical nature of the substrate to be equipped with chips.

The described groove can also have a plurality of groove portions which are interconnected at a branch point or at a plurality of branch points. Furthermore, at least a portion of the described groove can be a peripheral groove, which preferably runs around a center point of the surface of the substrate-receiving device or around a center point of the substrate fixed to the substrate-receiving device. The negative pressure can thus be applied in a largely symmetrical manner to the lower surface of the substrate to be equipped. This in turn means that the substrate to be equipped is not mechanically tensioned or is mechanically tensioned only negligibly as a result of the negative pressure. This also contributes considerably to a high placement accuracy.

In accordance with a further exemplary embodiment of the invention the placement machine also has a temperature-control device, which is thermally coupled to the one-piece support element and which is designed to keep the one-piece support element at least approximately at a constant temperature.

The temperature-control device, either actively or passively, can stabilize the temperature of the one-piece support element and therefore also of a substrate pneumatically fixed to the one-piece support element. A passive temperature stabilization can be implemented in a simple manner in that a gaseous or liquid heat-exchange medium having a predetermined temperature flows through a channel formed in the one-piece support element, but at least in the substrate-receiving device. An active temperature stabilization additionally also has a temperature feedback from a temperature sensor to a control unit of the temperature-control device, such that the temperature and/or the volume flow of the heat-exchange medium is always set such that at least that part of the one-piece support element thermally coupled to the substrate to be equipped is at a constant and preferably predefined temperature.

With regard to a precise retention of the position of the substrate within the placement machine, a temperature stabilization of the substrate to be equipped is of great importance in particular for the "embedded Wafer Level Process" (eWLP) and the System-in-Package (SiP) module production process described in the introduction because, in contrast to equipping a printed circuit board with SMD components, which often lasts less than a minute, when equipping the substrate with chips from a wafer the placement processes last much longer due to the typically much greater number of chips to be processed. Conventional durations for the equipping of the substrate with unhoused chips can lie between one hour and a number of hours. As a result, all changes (however minor) made over time to the placement machine and/or to the substrate to be equipped have a direct influence on the placement accuracy.

In accordance with a further exemplary embodiment the temperature-control device can be designed to cool the substrate-receiving device and in particular the one-piece support element such that this can assume a temperature that is lower by at least 2 Kelvin, in particular by at least 4 Kelvin and more particularly by at least 7 Kelvin than a direct ambient temperature of the substrate-receiving device. It can thus be ensured that any waste heat of components of the placement machine, said waste heat leading to an undesirable and hardly avoidable temperature increase in a spatial region under a protective hood of the placement machine, does not automatically result in the temperature of the substrate increasing as well. In particular, by means of a suitable adjustment of the temperature-control device, the substrate can assume a temperature during the placement process that is approximately the same as an ambient temperature of the placement machine. In practice this means that the substrate is not subjected to any temperature changes or is subjected only to negligible temperature changes as it is introduced into the placement machine and removed from the placement machine. A temperature increase of this type would specifically result in a change to the spatial dimensions of the substrate during the course of a placement process as the result of a thermal expansion and in a corresponding reduction of the placement accuracy.

In accordance with a further exemplary embodiment of the invention the one-piece support element has at least two markings which are optically identifiable and which are applied to the upper side of the one-piece support element, in particular outside a spatial region intended to receive the substrate to be equipped.

In an axially symmetrical arrangement, one of the two markings is preferably disposed to the left of the receiving region with respect to the transport direction, and the other of the two markings is preferably disposed to the right of the receiving region of the substrate to be equipped. On the basis of at least one marking of this type, the position of a placed chip relative to this marking can be determined with great accuracy by means of a suitable optical measurement. Provided the position of the marking in question within the described placement machine is accurately known, the actual position of a placed chip can be accurately determined within a coordinate system of the placement machine. Provided the position of the substrate (populated at least partially in the meantime) within the coordinate system of the placement machine is additionally accurately known, the actual position of a placed chip within a coordinate system of the substrate can then also be determined with great accuracy. If, with a position measurement of this type, a certain spatial offset is determined between the actual placement position and one of the predefined placement positions, an offset of this type can be compensated for at least approximately during subsequent placement processes by means of a suitable control of the movement of the placement head.

The exact positions of the optically identifiable markings can be measured using a highly accurate optical measuring machine prior to the installation of the substrate-receiving device or of a corresponding component of the substrate-receiving device, on which component the markings are located. In this way, the above-described optical measurement of placement positions can be carried out with particularly high accuracy.

The spatial arrangement of the two markings outside the region, which during operation of the placement machine is intended to receive the substrate, has the advantage that the (positions of the) markings can be measured even as a substrate is being equipped. It is thus also possible during a placement process, which, as described above, can last between one and two hours for example, to identify the placement positions in an optically exact manner and to thus ensure a continuously high placement accuracy.

In accordance with a further exemplary embodiment of the invention the one-piece support element has at least two further markings which are optically identifiable and which are applied to the upper side of the one-piece support element, in particular outside a spatial region intended to receive the substrate to be equipped.

One of the two further markings is preferably located to the left of the receiving region with respect to the transport direction, and the other of the two further markings is preferably located to the right of the receiving regions of the substrate to be equipped.

In this exemplary embodiment, a total of at least four optically identifiable markings are therefore provided on the one-piece support element. These four markings can be used to improve the placement accuracy for a first measurement purpose (A) and/or for a second measurement purpose (B), wherein it is assumed in each case that the four markings are arranged in a spatially fixed manner in the coordinate system of the placement machine or even define the coordinate system of the placement machine.

(A) measurement purpose 1: By measuring actual placement positions of chips set down onto the substrate relative to the four markings, it is possible to use an extended kinematic model for a compensation of placement positions by a suitable control of the movement of the placement head, in which model not only one-dimensional distortions and angular distortions, but for example also trapezoidal distortions can be mapped with a bi-linear coordinate transformation. This means that even a non-linear positioning behavior can be approximated, on the basis of the four markings, by a positioning system carrying the placement head, and can be superimposed on a mapping field which, as is known, is used to control, in a positionally accurate manner, a movement of the placement head individually for a large number of possible placement positions.

(B) measurement purpose 2: A special calibration module or a component can be set down by the placement head on or in the direct vicinity of the four markings in a calibration mode of the placement machine, wherein, as component, a type of component corresponding to the type of the placed components is preferably used. By means of a suitable optical positional measurement, a possible offset of the placement positions in the region of the four markings can be determined in a highly accurate manner. The obtained information can be superimposed on a mapping field. A mapping field of this type can then be used, as is known, to position the placement head by means of the above-mentioned positioning system, such that any potential warping of the positioning system can be compensated for in a location-dependent manner, that is to say individually for each placement position.

In accordance with a further exemplary embodiment of the invention the two markings have a spatial offset relative to one another perpendicularly to the transport direction. Furthermore, the two further markings also have a spatial offset relative to one another perpendicularly to the transport direction. In addition, each of the two markings has a spatial offset along the transport direction relative to each of the two further markings.

In a particularly simple implementation of this embodiment, the two markings have, relative to one another, exclusively one spatial offset perpendicularly to the transport direction (and no offset along the transport direction). The same is true for the two further markings. Here, there are also two marking pairs, which each comprise a marking and a further marking, wherein the markings of a pair have exclusively one spatial offset along the transport direction (and no offset perpendicularly to the transport direction). More specifically, in this implementation, all markings are placed in a right-angled two-dimensional grid on the one-piece support element.

If, as described above, the placement machine has a (surface) positioning system mounted on the chassis, and if not only the placement head, but also a camera, can be positioned using this positioning system, any potentially present spatial warping of various components of the positioning system, or any such warping occurring during the course of a placement process, can be identified by an optical measurement of in each case a pair of markings. A spatial warping of this type can be caused in particular by temperature fluctuations of the individual components of the positioning system.

More specifically, in the event of a warping of at least individual components of the positioning system, the coordinate system of said positioning system becomes distorted. This warping can be determined by an optical position measurement of the corresponding markings assumed to be stationary, and, during the further equipping of the substrate, can be compensated for by a suitable control of the positioning system. In particular with the use of a bi-linear model in order to determine the distortion, an extremely high placement accuracy, which is also stable over time, can thus be attained.

In accordance with a further exemplary embodiment of the invention at least one auxiliary marking is applied to the one-piece support element and is located along the transport direction between a marking and a further marking. Alternatively or in combination, at least one further auxiliary marking is also applied to the one-piece support element and is disposed along the transport direction between a marking and a further marking. This has the advantage that the accuracy of the determination of the distortion of the coordinate system of the positioning system can be further improved. This improvement is all the greater, the higher the number of auxiliary markings and/or further auxiliary markings.

In accordance with a further exemplary embodiment of the invention at least one mark of (a) the at least one marking, (b) the at least one further marking, (c) the at least one auxiliary marking and/or (d) the at least one further auxiliary marking is arranged outside the transport device.

In this context, "arranged outside" can mean in particular that the mark in question is arranged to the left or right of the transport device as considered along the transport direction. If the transport device, as described above, is provided by means of two mutually distanced transport elements, "arranged outside" then means that the mark in question is arranged on or applied to the one-piece support element either to the left of the left transport element or to the right of the right transport element.

The described spatial arrangement outside the transport device has the advantage that, in the case of a substrate having a width smaller than the distance between two marks distanced from one another perpendicularly to the transport direction, the mark in question is not covered by the substrate either during transport of the substrate or during an equipping of the received substrate. This makes it possible, in an advantageous manner, to equip substrates of corresponding length, wherein a substrate of this type may even be so long that it can be equipped in or by the placement machine only by means of clocked transport. In the case of a clocked transport of this type, the substrate is disposed temporarily at rest at different positions, distanced from one another, along the transport direction, such that some of the total number of chips to be processed can be set down with great accuracy onto the substrate to be equipped. The unhindered visual identifiability of the mark in question (from above by a camera) during a placement process creates the possibility of monitoring the placement accuracy quasi online. A high reliability when equipping substrates with chips is ensured in this way.

In accordance with a further exemplary embodiment of the invention the placement machine also has a reference element, which is secured to the one-piece support element, wherein the at least one mark is mounted on the reference element.

The reference element can be what is known as a scale, which is manufactured from a material having a very low thermal expansion. The at least one mark can be mounted on the reference element with an extremely high positional accuracy, or the position of the mark can be known as a result of a highly accurate measurement. The accuracy of the measurement of a distortion of the positioning system is thus improved further. The reference element can be what is known as a glass scale, for example.

In accordance with a further exemplary embodiment of the invention the placement machine also has a camera, which is positioned or can be positioned in such a way that the at least one mark and chips placed on the substrate can be recorded together in an image by the camera.

By providing a camera which is at least temporarily available at a suitable position in order to detect the various markings or the at least one mark and chips placed on the substrate, the accuracy of the described placement machine can be checked during the operation of the placement machine, continuously or at least at regular intervals. If a check of this type reveals that the placement of chips has resulted in an undesirable spatial offset detrimental to the positioning accuracy, this can be compensated for by the above-mentioned measures, that is to say in particular by a suitable control of the drives of the above-mentioned positioning system.

In accordance with an exemplary embodiment the camera can be arranged in a spatially fixed position relative to the placement head. This can mean in particular that the camera is mounted directly or indirectly on the placement head. The camera can thus be provided as a camera movable within the placement machine in a technically particularly simple manner.

A camera movable within the placement machine can not only identify the above-mentioned markings, but also structures on the substrate to be equipped with chips, such that the position of the substrate to be equipped within the coordinate system of the placement machine is known at least roughly. A measurement of this type of the position of the substrate may therefore be necessary because the substrate to be equipped is introduced into the placement region of the placement machine or is transferred to the one-piece support element by means of the transport device. By means of a position measurement of the optical structures mounted or formed on the substrate, the transport device can then be suitably controlled, such that the substrate to be equipped is transferred as accurately as possible into its position necessary or suitable for the placement.

In accordance with a further exemplary embodiment of the invention the placement machine also has (a) a further feed device for providing a further wafer, which likewise has a multiplicity of chips; and (b) a further placement head for picking up chips from the provided further wafer and for placing the picked-up chips in predefined placement positions on the substrate. This has the advantage that the placement machine can be operated in an operating mode in which the two placement heads alternately receive chips from their associated feed device and fit said chips on the substrate to be equipped.

More precisely: Within a first time window, chips are picked up from the (first) feed device by the (first) placement head and chips already received by the (second) further placement head are set down onto the substrate. Within a subsequent second time window, chips are picked up by the (second) further placement head from the (second) feed device and chips received previously from the (first) feed device are set down by the (first) placement head onto the substrate. By means of such a reciprocal operation of the two placement heads, the placement efficiency can be at least approximately doubled.

In accordance with a further aspect of the invention a method for equipping a substrate with unhoused chips comprising a placement machine and in particular comprising a placement machine of the above-mentioned type is described. The described method comprises the steps of (a) providing a wafer, which has a multiplicity of chips, by means of a feed device; (b) transporting the substrate to be equipped along a transport direction by means of a transport device on an upper side of a one-piece support element of a substrate-receiving device such that the substrate is disposed at least approximately in a predetermined processing position, wherein the transport device is spatially integrated in the one-piece support element on the upper side of the one-piece support element; (c) laying and fixing the substrate on the upper side of the one-piece support element; and (d) equipping the substrate with chips by means of a placement head which picks up the chips from the provided wafer and places the picked-up chips on the received substrate at predefined placement positions. In accordance with the invention the one-piece support element and the transport device are components of a substrate-receiving device which is movable by means of a lifting device relative to a chassis of the placement machine along a vertical z-direction, such that the upper side of the substrate to be equipped lies in a predefined placement plane.

The described method is also based on the finding that, by means of an integration of a transport function (provided by the described transport device) in the one-piece support element of the substrate-receiving device, the substrate-receiving device and in particular one-piece support element thereof can have, perpendicularly to the transport direction, a spatial dimension, referred to hereinafter as width, which is greater than the width of the transport device. Optically identifiable markings can thus be applied laterally from the transport device, i.e. to the left and right with respect to the transport direction, to the one-piece support element and, with an appropriate width (=direction perpendicularly to the transport direction) of the substrate to be equipped, are not covered by the substrate. These markings can thus be detected by a camera during an equipping of the substrate with chips (possibly together with chips already placed). In this way, the placement accuracy of the placement machine can also be monitored during conventional operation thereof.

The predetermined processing position is, in accordance with the invention, that position of the substrate within the placement machine in which the substrate is populated with the chips.

In accordance with a further exemplary embodiment of the invention the substrate has a plate and adhesive film, which is applied to the plate on a flat upper side.

The described adhesive film can be, in particular, a two-sided adhesive film, such that not only is the adhesive film adhered to the support plate, but the set-down chips are also adhered to the adhesive film. The adhesive film can be applied in a uniform manner to the support plate in particular by means of lamination.

The adhesive film is preferably what is known as a thermal removal layer, which is characterized in that the stickiness of the adhesive film decreases or even disappears completely in the event of a heat treatment. When producing housed components, in a subsequent step, that is to say after a joint potting of the placed chips using a curable potting compound, the potted components can be easily removed from the adhesive film.

In accordance with a further exemplary embodiment of the invention the method also comprises the steps of (a) detecting the position of two optical structures, disposed on the fed substrate, when the substrate is in the processing position; (b) determining the exact spatial position of the fed substrate relative to the chassis on the basis of the detected positions; and (c) determining the coordinates of the predetermined placement positions in a coordinate system of the placement machine on the basis of the determined exact spatial position of the substrate. Here, the predetermined placement positions on the substrate are dependent on the determined coordinates.

In a simple exemplary embodiment the two optical structures can be simply two holes, which are applied to or formed on the substrate at an edge, in particular in opposing positions. The use of simple holes as optical structures has the advantage that these holes can also be used for a mechanical handling of the substrate, for example by means of centering pins.

It should also be noted that the substrate to be equipped can of course also have more than two optically identifiable structures. The accuracy of the positioning determination of the substrate in the coordinate system of the placement machine can thus be further improved.

The two optical structures of the substrate can also be used, after a, for example, pneumatic fixing of the substrate to the one-piece support element, to model the substrate as a rigid fixed body (that is to say without warping), such that each possible placement position on the substrate with respect to the two optical structures is accurately defined.

In accordance with a further exemplary embodiment of the invention the method also includes a detection of the positions of at least two markings disposed on the one-piece support element. Here, the predetermined placement positions on the substrate are also dependent on the positions of the at least two markings.

The two markings can be used for a highly accurate relative position measurement of placed chips. The placement accuracy of the placement machine can thus be easily monitored during operation thereof, and a potentially occurring spatial offset of the placement positions can be compensated for by a suitable control of a positioning system carrying the placement head.

The two markings are preferably detected by means of a camera and a data processing unit arranged downstream of the camera, which data processing unit processes and/or analyses the image. In order to improve the accuracy of the method described here, further markings can also be taken into consideration, which are likewise disposed on the one-piece support element.

In accordance with a further exemplary embodiment of the invention the positions of the at least two markings are detected repeatedly at predefined time intervals during the equipping of the substrate, and the coordinates of the predetermined placement positions are corrected on the basis of the detected positions.

More specifically, the at least two markings are measured cyclically during the operation of the placement machine. In addition to the compensation of thermal effects and a suitable approximation of a non-linear behavior of a positioning system carrying the placement head, spatial changes can thus also be identified and compensated for, possibly during the placement, said spatial changes occurring over longer periods of time and the causes of said changes possibly being unknown.

In accordance with a further exemplary embodiment of the invention the method also comprises the steps of (a) measuring the position of a module placed on the substrate; (b) re-measuring the position of the module at a later moment in time during the equipping of the substrate with unhoused chips; and (c) determining a relative positional shift of the module between the first measurement and the second measurement. Here, the predetermined placement positions on the substrate are also dependent on the positional shift of the module.

More specifically, a time-dependent positional change or positional shift of the populated module occurring over time is observed, and from this a time-dependent distortion of the positioning system is indicated, this being caused in particular by the above-described effects of temperature changes on components of the positioning system. Alternatively or in combination with the use of the above-mentioned markings, further markings, auxiliary markings and/or further auxiliary markings, a time-dependent distortion of the positioning system can also be determined on the basis of support points disposed within the placement field of the placement machine. Here as well it is true that the accuracy of the distortion determination increases with the number of modules taken into consideration for the determination.

In accordance with a further exemplary embodiment of the invention the module is a calibration module and has an optically identifiable structure.

The use of special calibration modules has the advantage that the visually identifiable structure can be identified easily and reliably. The visually identifiable structure can also be mounted on the calibration module with an extremely high spatial accuracy.

The calibration modules can be, for example, glass modules, which can be produced with an extremely high accuracy. In addition, the glass modules can consist of a special glass which has a very low thermal expansion, such that the accuracy of the above-described measurement of a distortion of the positioning system can be particularly high.

In accordance with a further exemplary embodiment of the invention the module is a placed unhoused chip. Here as well a visually identifiable structure possibly present on the chip for a highly accurate determination of the position of the module can be used for an optical measurement. A suitable visually identifiable structure can be, for example, an edge of the unhoused chip.

It should be noted that embodiments of the invention have been described with reference to different subjects of the invention. In particular, some embodiments of the invention are described with device claims and other embodiments of the invention are described with method claims. However, it will be immediately clear to a person skilled in the art upon reading this application that, unless explicitly specified otherwise, in addition to a combination of features belonging to one type of inventive subject, any combination of features belonging to different types of inventive subjects is also possible.

Further advantages and features of the present invention will become clear from the following exemplary description of currently preferred embodiments. The individual figures of the drawing of this document are to be considered merely as schematic and not as true to scale.

BRIEF DESCRIPTION OF THE DRAWING

FIGS. 5a and 5b illustrate a placement machine which has a modified support element 532, in which a pneumatic multiple interface 533 is formed.

DETAILED DESCRIPTION

Figure 1:
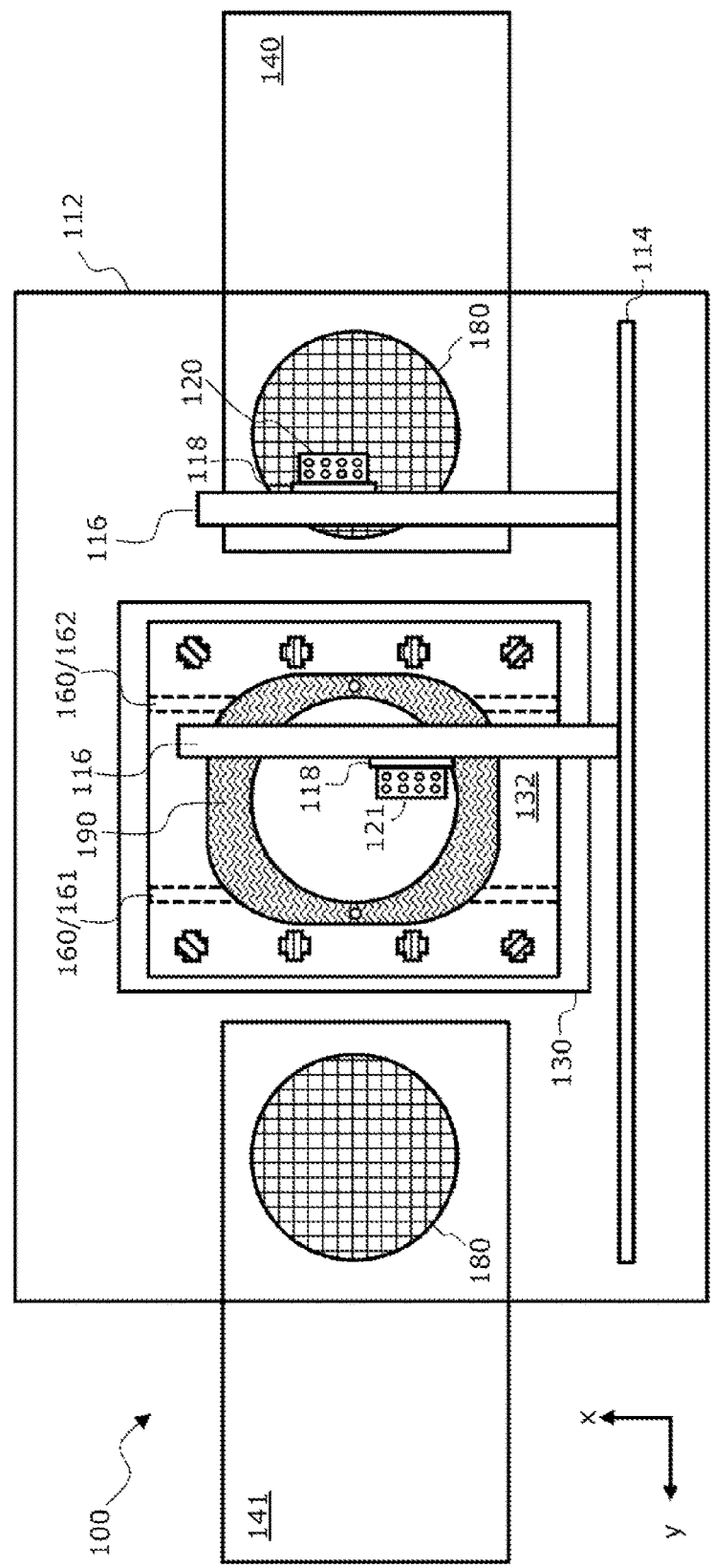
FIG. 1 shows a placement machine according to an exemplary embodiment of the invention, said placement machine having two wafer feed devices and two placement heads.

It should be noted that, in the following detailed description, features or components of different embodiments which are identical or at least functionally identical to the corresponding features or components of another embodiment are provided with the same reference signs or with a reference sign which differs from the reference sign of the identical or at least functionally identical features or components merely by the first number. In order to avoid unnecessary repetitions, features or components already explained on the basis of a previously described embodiment will not be described in greater detail at a subsequent point.

It should also be noted that the embodiments described hereinafter constitute merely a limited selection of possible variants of the invention. In particular, it is possible to suitably combine the features of individual embodiments with one another such that, with the variants presented explicitly here, a large number of different embodiments are to be considered as clearly disclosed to a person skilled in the art.

In addition, it should be noted that terms relating to space, such as "in front" and "behind", "above" and "below", "left" and "right", etc. are used in order to describe the relationship of one element to another element or to other elements as illustrated in the figures. The terms relating to space can therefore apply to orientations which differ from the orientations illustrated in the figures. However, it goes without saying that all terms of this type relating to space relate, for the sake of simplicity of the description, to the orientations illustrated in the drawings and are not necessarily limiting, since the relevant illustrated device, component, etc., when in use, can assume orientations which can be different from the orientations illustrated in the drawing.

Before exemplary embodiments of the invention are described with reference to the figures, some considerations will be presented hereinafter in conjunction with exemplary embodiments of the invention.

FIG. 1 shows a placement machine 100 in accordance with a first exemplary embodiment of the invention. The placement machine 100 has a chassis 112, on which two surface positioning systems, each for moving a placement head 120 and 121, are mounted, such that these can be moved in a plane parallel to the drawing plane. The two surface positioning systems have, as first and commonly used component, a support rail 114, which is stationary with respect to the chassis. As second (not common) components, two transversely extending support arms 116 are mounted on the support rail 114 and can be moved along a y-direction. Here, one support arm 116 is assigned to one positioning system, and one support arm 116 is assigned to the other positioning system. Both positioning systems also each have a movable support plate 118, which is mounted on the relevant support arm 116 and can be moved along the x-direction. The placement heads 120 and 121 are mounted on the two support plates 118 by means of a fixed screw connection.

The placement machine 100 also has two wafer feed devices, that is to say a wafer feed device 140 and a further wafer feed device 141. In other embodiments (not illustrated), another type of feed device (for example belt or magazine feed devices) can be used instead of at least one wafer feed device. With each of the two wafer feed devices 140, 141, a wafer 180 can be brought from a wafer store (not illustrated in FIG. 1) into a provision region, from which individual chips can be picked up with use of the respective placement heads 120, 121. The placement heads 120, 121 are preferably what are known as multiple placement heads, which each have a plurality of suction pipettes illustrated in FIG. 1 as small circles. A chip can be temporarily received by each suction pipette. In accordance with the exemplary embodiment illustrated here, the suction pipettes can be moved individually along a z-direction, which is oriented perpendicularly to the drawing plane and is therefore oriented both perpendicularly to the y-direction and perpendicularly to the x-direction. Alternatively, other head topologies can also be used, such as collect & place revolver heads.

The chips received by the respective placement heads 120, 121 are then transferred by suitable control of the relevant surface positioning system into a placement region in which they are set down at predefined placement positions onto a substrate 190 to be equipped.

The placement machine 100 provided with the two placement heads 120, 121 and the two feed devices 140, 141 can be operated advantageously in an operating mode in which the two placement heads 120, 121 each alternately receive chips from their assigned feed device 140, 141 and fit said chips onto the substrate 190 to be equipped. The placement efficiency can thus be significantly increased. In this context, the term "placement efficiency" is to be understood to mean the number of chips that can be picked up by the two placement heads 120, 121 and set down onto the substrate 190 within a predefined unit of time, for example 1 hour.

The placement machine 100 also has a substrate-receiving device 130, which, in accordance with the exemplary embodiment illustrated here, has a one-piece support element 132 and a transport device 160 integrated in the one-piece support element 132. The transport device 160 comprises (a) a first transport element 161, which is provided by means of a first transport belt, and (b) a second transport element 162, which is provided by means of a second transport belt.

In accordance with the exemplary embodiment illustrated here, the transport device 160 can assume two operating states. In a first operating state the transport belts 161, 162 are fully recessed in the one-piece support element, such that the entire transport device 160 is disposed below a support plane determined by the upper side of the one-piece support element 132. In a second operating state at least part of the transport belts 161, 162 is disposed above this support plane.

In the first operating state, as will be explained further below, the substrate 190 to be equipped can be fixed flat to the surface of the support element 132 and can then be populated with chips. In the second operating state the substrate 190 is at least slightly distanced from the surface of the support element 132 and can be moved or transported along the x-direction relative to the substrate-receiving device 130. By means of a transport of this type, the substrate is brought, prior to its equipping, into a placement region (on the one-piece support element 132) and, after an at least partial equipping, is transported away from this placement region. The x-direction is consequently the transport direction of the transport device 160.

As will be explained further below, the substrate 190 to be equipped is held or fixed during the placement process in a fixed spatial position in a coordinate system of the placement machine 100. At this juncture, it should be noted that, in contrast to an equipping of printed circuit boards with housed electronic components, an equipping of the substrate 190 with unhoused chips lasts much longer, since the substrate 190 is typically populated with a much higher number of chips compared with the number of housed electronic components to be placed on a printed circuit board. For this reason, extremely high requirements are placed on the accuracy of the positioning and fixing of the substrate 190 to be equipped on the one-piece support element 132. In this regard, it must be ensured specifically that neither the position of the substrate 190 as a whole nor the positions of individual regions of the substrate 190 change during the entire equipping duration, lasting for example for two hours. The same is true for the movement paths of the surface positioning system in question. In view of heat inputs, which can never be avoided and which are caused for example by motors of the respective surface-positioning systems 114, 116, 118, extremely high temperature stability, in particular of the one-piece support element 132, must therefore be ensured.

The structure of the one-piece support element 132 and the operating principle of the placement machine 100 will be explained in greater detail hereinafter with reference to FIG. 2. The transport device 160 of the placement machine 100 illustrated here is formed in such a way that its two transport elements 161, 162 are arranged at a distance from one another which is smaller than the width of the substrate 190. The two transport elements 161, 162 consequently do not act on the edges of the substrate 190. Rather, for transport of the substrate 190 along a transport direction T, the substrate rests on the two transport elements 161, 162 formed as transport belts.

Figure 2:
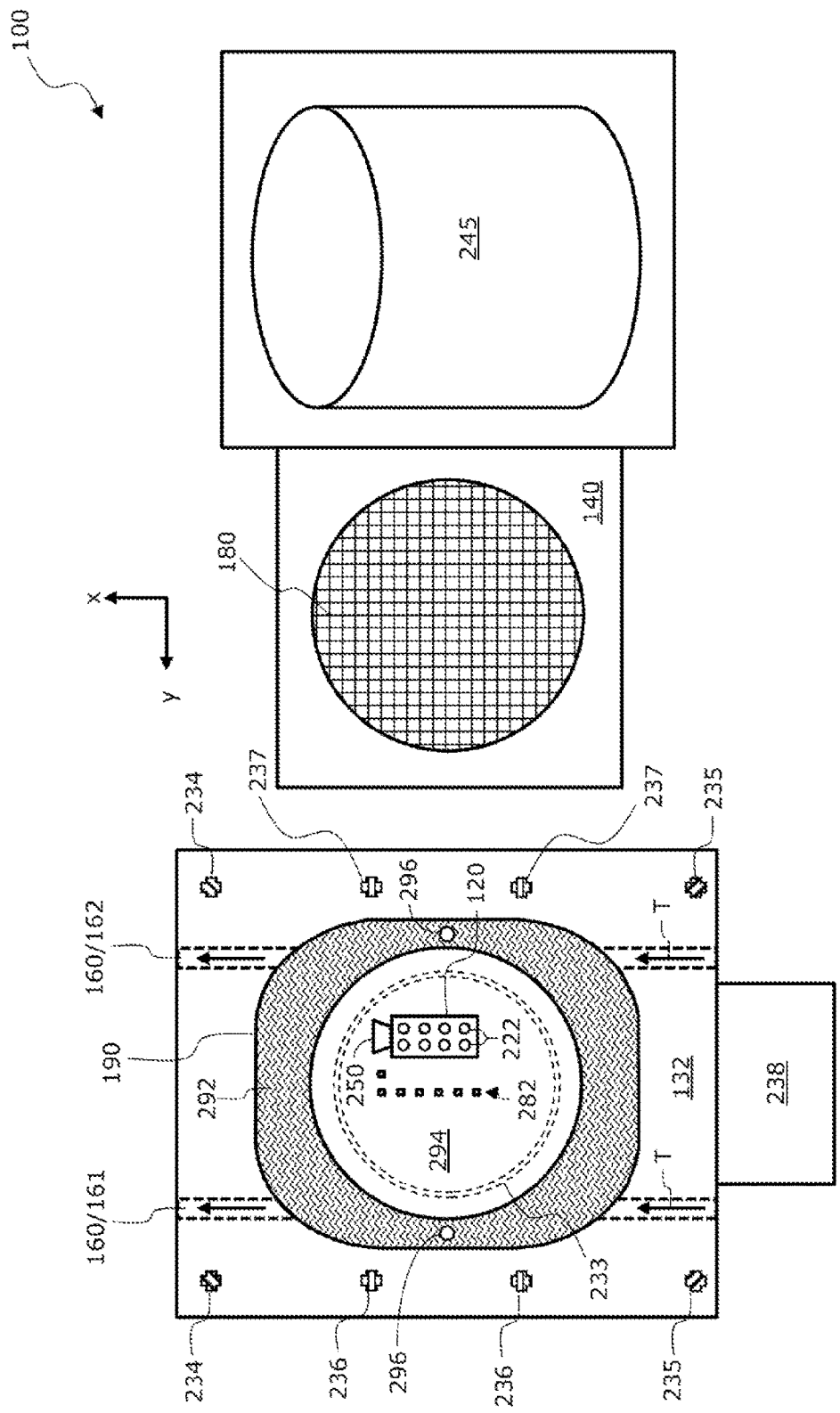
FIG. 2 shows an enlarged illustration of part of the placement machine according to FIG. 1.

As can be seen from FIG. 2, the wafer feed device 140 is assigned a wafer store 245, in which a plurality of wafers (not illustrated), each having a multiplicity of unhoused chips, are stacked one above the other. By means of the wafer feed device 140, a wafer 180 can be removed from the wafer store 245 and, following a placement of the corresponding chips, the wafer 180 at least partially emptied of chips can be brought back into the wafer store 245.

In accordance with the exemplary embodiment illustrated here, the placement machine 100 has a temperature-control device 238, which is intended to keep at least the upper region of the substrate-receiving device 130 and therefore the one-piece support element 132 at an at least approximately constant temperature. In this way, undesirable thermal stresses can be avoided and a high positional accuracy of the substrate 190 as a whole can be ensured.

In order to fix the substrate 190, the substrate-receiving device 130 has, on its surface, a pneumatic interface 233, which, in accordance with the exemplary embodiment illustrated here, is formed as a groove running around a center of the one-piece support element 132. A negative pressure can be generated in the groove 233 using a vacuum generation unit (not illustrated), such that the flat underside of the substrate 190 is suctioned against the one-piece support element 132.

For a rough positioning or centering of the substrate 190 on the one-piece support element 132 by means of the transport device 160, two optical structures 296 arranged opposite one another are formed in the outer region of the substrate 190. In accordance with the exemplary embodiment illustrated here each of the two optical structures is formed by means of a single hole 296.

It should be noted that the substrate used is a conventional substrate 190, which, as is known, has a preferably metal support plate 292 and a double-sided adhesive film 294 applied to the support plate 292. The chips are placed on this adhesive film 294 and are denoted in FIG. 2 by reference sign 282. The chips 282 are placed in the known manner by a suitable positioning of the placement head 120 and by a lowering of a chip-holding device 222 formed as a suction pipette along the z-direction, which is perpendicular to the drawing plane.

The above-described centering of the substrate 190 on the one-piece support element 132 is based on an optical measurement of the positions of the structures 296. In accordance with the exemplary embodiment illustrated here, a camera 250 is used for this purpose and is advantageously mounted on the movable placement head 120 and therefore can be placed suitably above the structure 296 to be measured by means of a suitable control of the surface positioning system (not shown in FIG. 2). If, during this measurement, the position of the camera 250 within the coordinate system of the placement machine 100 or of the surface positioning system is accurately known, the coordinates of the substrate 190 in the coordinate system of the placement machine 100 can be determined by a suitable image evaluation of an image recorded by the camera 250.

Alternatively or in combination, various markings 234, 235, 236, 237 can also be used in order to optically determine the relative position of the substrate 190 with respect to these markings 234, 235, 236, 237. For this purpose, it is merely necessary to detect, with the camera 250, both the optically identifiable structures 296 and at least two of the markings 234, 235, 236, 237.

As can be seen from FIG. 2, each of all of the aforementioned markings, that is to say two markings 234, two further markings 235, two auxiliary markings 236, and two further auxiliary markings 237, is disposed either to the left or right of the transport device 160. More specifically, all of these markings 234, 235, 236, 237 are disposed so close to the left or right edge of the one-piece support element 132 that they are not covered by the substrate 190 (at any point during transport of the substrate 190).

On the basis of a position measurement of at least some of the markings 234, 235, 236, 237, any potential distortion of the surface positioning system can be determined even during conventional operation of the placement machine 100 and can be taken into consideration in a compensating manner during the placement of chips 282. As already explained above in detail, a distortion of this type can be caused in particular by thermally induced warping of at least one component of the surface positioning system.

It should be noted that the number of markings used is in no way limited to the total of eight markings 234, 235, 236, 237 illustrated in FIG. 2. The following is true in general: the greater the number of markings, the more accurate can be the optical measurement.

At least one of the markings 234, 235, 236, 237 can also be measured jointly with a chip 282 that has already been placed. In this way, similarly to an automatic optical inspection (AOI) of placement contents, the accurate actual position of the chip 282 in question can be measured. Any deviation from a target position can then be taken into consideration during the future placement of further chips and can be compensated for by a suitable control of the surface positioning system.

It should be noted that the markings 234, 235, 236, 237 have highly accurate inner structures, the positions of which on the one-piece support element 132 are known with extremely high accuracy. For this purpose, the one-piece support element 132 is preferably measured together with its markings 234, 235, 236, 237 using a highly accurate optical measuring machine, prior to the installation of said support element in the placement machine 100. The position data of the coordinates of the markings 234, 235, 236, 237 are thus known accurately, such that these can be used for a highly accurate measurement of the positions of the placed chips 282.

By means of a regular measurement of the exact placement positions, any offsets occurring and potentially varying over time with respect to the placement position can be identified and compensated for by a suitable control of the corresponding surface positioning system.

It should be noted that the substrate 190 equipped with chips 282 can also be measured later outside the placement machine 100 using a highly accurate optical measuring machine (not illustrated). For a subsequent equipping of further substrates 190, the surface positioning system can also be suitably activated on the basis of the actual placement positions thus obtained, such that chips to be processed in the future can be placed with extremely high accuracy on the substrate 190. This can also be carried out in particular within the scope of a quality check of the placement machine 100 prior to delivery to a client.

It should also be noted that the substrate-receiving device and therefore also the one-piece support element 132 can be stored ready in a number of different formats and/or sizes. The placement machine 100 can thus be easily adapted to operation with different substrate formats.

Figure 3:
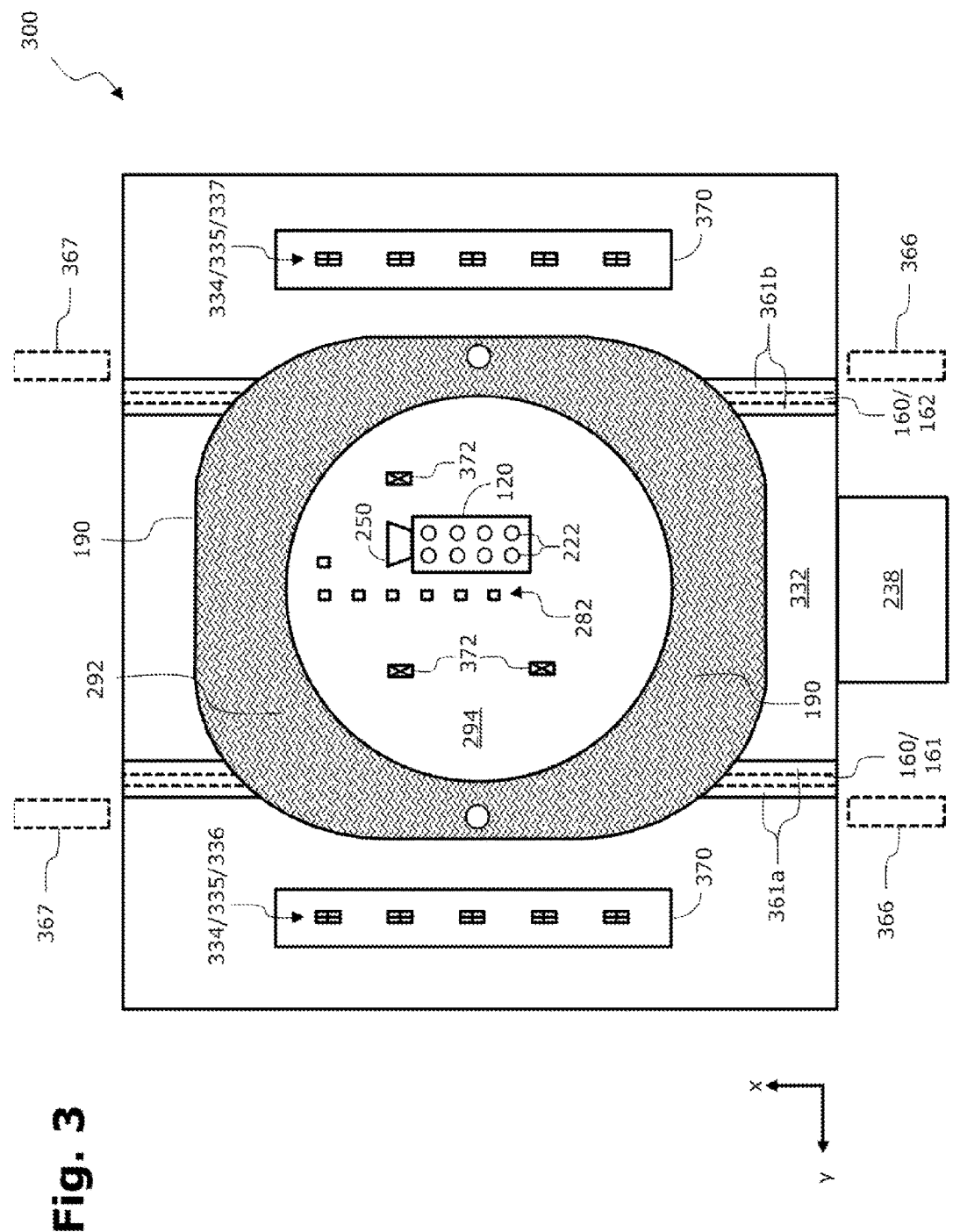
FIG. 3 shows a placement machine according to a further exemplary embodiment of the invention, in which a plurality of markings are applied to a total of two reference elements formed as a glass scale.

FIG. 3 shows a placement machine 300 in accordance with a further exemplary embodiment of the invention. In the case of the placement machine 300 the markings are not directly applied to the one-piece support element 332. Rather, two reference elements 370 formed as glass scales are provided, to which appropriate markings 334, 335, 336, 337 having high spatial accuracy are applied.

As can be seen from FIG. 3, two elongate transport grooves 361a, 361b are formed in the one-piece support element 332, in which grooves the two transport belts 161, 162 are embedded. As already explained before, as the substrate 190 is transported, at least the portions of the two transport belts 161, 162 on which the substrate 190 rests have a vertical position, perpendicularly to the drawing plane, which is above the surface of the one-piece support element 332. For the pneumatic fixing of the substrate 190, the two transport belts 161, 162 are lowered or pressed down by the substrate such that they are disposed completely within the two transport grooves 361a, 361b. An active lowering and/or a passive pressing down of the two transport belts 362 can be implemented in a wide range of different ways, which are known to a person skilled in the art, that is to say a designer in the field of mechanical engineering, and therefore will not be explained further at this juncture.

In FIG. 3 transport cheeks are also shown, which in accordance with the exemplary embodiment illustrated here comprise two input-side transport cheeks 366 and two output-side transport cheeks 367. A substrate 190 to be equipped is transferred from the input-side transport cheeks 366 to the transport system 160. An at least partially equipped substrate 190 is transferred from the transport system 160 to the output-side transport cheeks 367. This means that the transport system 160 is part of a superordinate transport system (not illustrated in greater detail) which connects the placement machine 300 to further processing machines for the production of electronic components and in particular of eWLP or SIP modules.

As already described before, a change constituted by a (for example thermally induced) warping of the surface positioning system carrying the placement head can be identified with the placement machine 300. A change constituted by the warping or distortion of the surface positioning systems can occur during the equipping of the substrate 190 with unhoused chips 282, said equipping potentially lasting from one to two hours, for example. In accordance with the exemplary embodiment illustrated here, a warping or a distortion of this type is monitored on the basis of an equipping of what are known as calibration modules 372, of which the position in the coordinate system of the surface positioning system is measured cyclically by means of the camera 250. Any potential change in position of the calibration modules 372 (in the coordinate system of the surface positioning system) can thus be identified, and from this a modified distortion (in the coordinate system of the surface positioning system) can be determined as appropriate and can be taken into consideration in a compensating manner when placing further chips 282.

The calibration modules 372 can consist in particular of a glass material having an extremely low thermal expansion and consequently can be referred to as glass modules. Structures which can be easily identified optically and which are fine in terms of their position and shape can also be mounted or formed in a highly precise manner on the calibration modules 372 and are used for the described optical measurement and, as a result of their precision, enable an extremely accurate determination of the distortion of the coordinate system of the surface positioning system.

Figure 4:
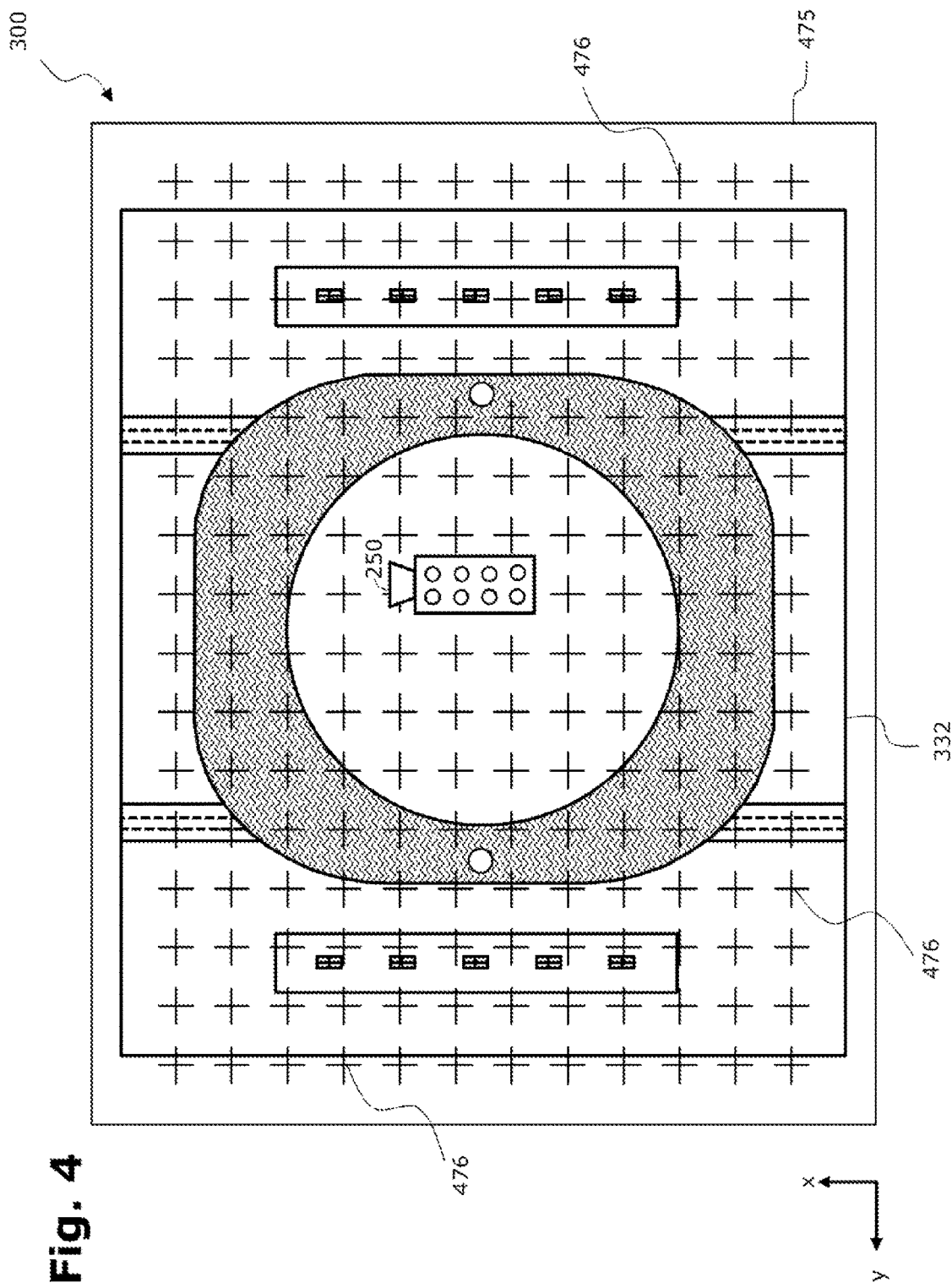
FIG. 4 shows the placement machine from FIG. 3, wherein a mapping plate is placed on the one-piece support element for the purpose of the calibration.

FIG. 4 shows the placement machine from FIG. 3, wherein, for the purpose of a calibration of the surface positioning system, what is known as a mapping plate 475 is laid onto the one-piece support element 332. It should be noted that, due to the mapping plate 475, provided this is not a substantially transparent mapping plate, the structures below the mapping plate 475 are not visible. In order to be able to better compare FIGS. 3 and 4, some of these structures, which in reality would be hidden, have been nevertheless illustrated in FIG. 4.

The mapping plate 475 has, as is known, a multiplicity of markers 476, which are formed in a spatially exact grid at predetermined positions. In accordance with the exemplary embodiment illustrated here the camera 250 can identify both the markings 334, 335, 336, 337 and the marks 476. On the basis of the detected positions both of some of the markings 334, 335, 336, 337 and of some of the marks 476, the spatial warping of the surface positioning system can be particularly accurately determined.

FIGS. 5a and 5b illustrate a placement machine 500 which has a one-piece support element 532, in which a pneumatic multiple interface 533 is formed. In accordance with the exemplary embodiment illustrated here, the multiple interface has a total of three peripheral grooves 533, which are arranged or extend concentrically with respect to a center point of the one-piece support element 532.

The upper images of these two figures each show a plan view (of a detail) of the placement machine. The lower images each show a cross-sectional view of part of the placement machine.

In FIG. 5a the placement machine 500 is illustrated in a state in which an equipping of the substrate (not illustrated) can take place. In FIG. 5b the placement machine 500 is illustrated together with a mapping plate 475 in a state in which a calibration of the placement machine 500 can be carried out. In order to achieve the best possible calibration of the placement machine 500 for a highly accurate placement, a lifting device 513 is provided, by means of which the substrate-receiving device 130 and therefore also the one-piece support element 532 can be moved relative to the chassis (not illustrated) of the placement machine along the vertical z-direction in such a way that, in the second state (calibration), the upper side of the mapping plate 475 (see FIG. 5b) and, in the first state (placement), the upper side of the markings 334, 335, 336, 337 (see FIG. 5a) lie exactly in a measurement and placement plane 595.

LIST OF REFERENCE SIGNS

100 Placement machine
112 Chassis
114 First component/stationary support rail
116 Second component/movable transversely extending support arm
118 Third component/movable support plate
120 Placement head
121 Further placement head
130 Substrate-receiving device
132 One-piece support element
140 Wafer-feeding device
141 Further wafer-feeding device
160 Transport device
161 First transport element/first transport belt
162 Second transport element/second transport belt
180 Wafer
190 Substrate
222 Chip-holding devices/suction pipettes
233 Pneumatic interface/peripheral groove
234 Markings
235 Further markings
236 Auxiliary markings
237 Further auxiliary markings 238 Temperature-control device
245 Wafer store
250 Camera
282 Chips (placed)
292 Support plate
294 Adhesive film
296 Optically identifiable structure/hole
T Transport direction
300 Placement machine
332 One-piece support element
334 Markings
335 Further markings
336 Auxiliary markings
337 Further auxiliary markings
361a Transport groove
361b Transport groove
366 Input-side transport cheeks
367 Output-side transport cheeks
370 Reference element/glass scale
372 Calibration modules
475 Mapping plate
476 Marks
500 Placement machine
513 Lifting device in first state
532 One-piece support element
533 Pneumatic multiple interface/peripheral grooves
595 Measurement and placement plane

The invention claimed is:

1. A placement machine for equipping a substrate with unhoused chips for electronic components each having at least one chip disposed in a housing, the placement machine comprising:
a chassis;
a feed device for providing a wafer which has a multiplicity of chips,
wherein the feed device is mounted on the chassis,
a lifting device is mounted on the chassis;
a substrate-receiving device for receiving the substrate to be equipped,
wherein the substrate-receiving device is mounted on the lifting device and is moved relative to the chassis along a z-direction by the lifting device;
a placement head for picking up chips from the provided wafer and for placing the picked-up chips at predefined placement positions on the received substrate;
wherein the substrate-receiving device comprises a one-piece support element that constitutes at least an upper part of the substrate-receiving device,
wherein the substrate to be equipped is configured to be laid on the one-piece support element; and
a transport device for transporting the substrate on an upper side of the one-piece support element along a transport direction;
wherein the transport device is spatially integrated in the one-piece support element on the upper side of the one-piece support element, and
wherein an upper side of the one-piece support element has at least two optically identifiable markings outside a spatial region configured to receive the substrate to be equipped.

2. The placement machine according to claim 1, wherein the transport device comprises two transport elements extending along the transport direction and distanced from one another perpendicularly to the transport direction, and
the two transport elements are configured to receive the substrate to be equipped via its underside.

3. The placement machine according to claim 2,
wherein the two transport elements each have a transport belt, and
wherein two transport grooves are formed in the one-piece support element and extend along the transport direction and are formed in such a way that a transport belt extends in each transport groove.

4. The placement machine according to claim 1, wherein the transport device has two operating states,
wherein in a first operating state the transport device is fully integrated in the one-piece support element, such that the entire transport device is disposed below a support plane determined by the upper side of the one-piece support element, and
in a second operating state at least part of the transport device is disposed above the support plane.

5. The placement machine according to claim 1, wherein the one-piece support element has a pneumatic interface configured to apply a negative pressure to a lower surface of the substrate.

6. The placement machine according to claim 1, further comprising:
a temperature-control device thermally coupled to the one-piece support element, and configured to keep the one-piece support element at least approximately at a constant temperature.

7. The placement machine according to claim 1, wherein the upper side of the one-piece support element has at least two further optically identifiable markings outside a spatial region configured to receive the substrate to be equipped.

8. The placement machine according to claim 7,
wherein the at least two markings relative to one another have a spatial offset perpendicularly to the transport direction,
wherein the at least two further markings relative to one another likewise have a spatial offset perpendicularly to the transport direction, and
wherein each of the at least two markings relative to each of the two further markings has a spatial offset along the transport direction.

9. The placement machine according to claim 1,
wherein at least one auxiliary marking is applied to the one-piece support element and is disposed along the transport direction between a marking and a further marking, and/or
wherein at least one further auxiliary marking is applied to the one-piece support element and is disposed along the transport direction between a marking and a further marking.

10. The placement machine according to claim 1,
wherein at least one mark of at least one of:
(a) the at least two markings,
(b) the at least two further markings,
(c) the at least one auxiliary marking, and/or
(d) the at least one further auxiliary marking,
is arranged outside the transport device.

11. The placement machine according to claim 1, further comprising a reference element, secured to the one-piece support element,
wherein at least one mark is mounted on the reference element.

12. The placement machine according to claim 1, further comprising:
a camera configured to be positioned in such a way that at least one marking and chips placed on the substrate are recorded together in an image by the camera.

13. The placement machine according to claim 1, further comprising:
- a further feed device for providing a further wafer, which likewise has a multiplicity of chips; and
- a further placement head for picking up chips from the provided further wafer and for placing the picked-up chips on the substrate in predefined placement positions.

14. A method for equipping a substrate with unhoused chips using a placement machine said method comprising:
- providing a wafer by a feed device, the wafer having a multiplicity of chips;
- transporting the substrate to be equipped along a transport direction by a transport device on an upper side of a one-piece support element of a substrate-receiving device such that the substrate is disposed at least approximately in a predetermined processing position,
- wherein the transport device is spatially integrated in the one-piece support element on the upper side of the one-piece support element;
- laying and fixing the substrate on the upper side of the one-piece support element;
- equipping the substrate with chips by a placement head which picks up the chips from the provided wafer and places the picked-up chips on the received substrate at predefined placement positions;
- wherein the one-piece support element and the transport device are components of a substrate-receiving device moved by a lifting device relative to a chassis of the placement machine along a z-direction, such that the upper side of the substrate to be equipped lies in a predefined placement plane; and
- detecting positions of at least two markings positioned on the one-piece support element,
- wherein the predefined placement positions on the substrate are dependent on the positions of the at least two markings.

15. The method according to claim 14, wherein the substrate has a plate and an adhesive film applied to the plate on a flat upper side.

16. The method according to claim 14, further comprising:
- detecting the position of two optical structures, disposed on the fed substrate, when the substrate is in the processing position;
- determining the exact spatial position of the fed substrate relative to the chassis on the basis of the detected positions; and
- determining the coordinates of the predetermined placement positions in a coordinate system of the placement machine on the basis of the determined exact spatial position of the substrate;
- wherein the predetermined placement positions on the substrate are dependent on the determined coordinates.

17. Method The method according to claim 14, wherein the positions of the at least two markings are detected repeatedly at predefined time intervals during the equipping of the substrate, and
the coordinates of the predefined placement positions are corrected on the basis of the detected positions.

18. The method according to claim 14, further comprising:
- measuring a position of a module placed on the substrate;
- re-measuring the position of the module at a later moment in time during the equipping of the substrate with unhoused chips; and
- determining a relative positional shift of the module between the first measurement and the second measurement;
- wherein the predetermined placement positions on the substrate are dependent on the positional shift of the module.

19. The method according to claim 18, wherein
the module is a calibration module and has an optically identifiable structure.

20. The method according to claim 18, wherein
the module is a placed unhoused chip.

* * * * *